United States Patent

Ouchi

[11] Patent Number: 5,994,234
[45] Date of Patent: Nov. 30, 1999

[54] METHOD FOR DRY-ETCHING A POLYCIDE FILM

[75] Inventor: Masahiko Ouchi, Tokyo, Japan

[73] Assignee: NEC Corporation, Tokyo, Japan

[21] Appl. No.: 08/989,632

[22] Filed: Dec. 12, 1997

[30] Foreign Application Priority Data

Dec. 12, 1996 [JP] Japan ................................. 8-331903

[51] Int. Cl.$^6$ .............................................. H01L 21/467
[52] U.S. Cl. ........................ 438/719; 438/721; 438/737; 438/738
[58] Field of Search .................... 438/719, 721, 438/737, 738

[56] References Cited

U.S. PATENT DOCUMENTS

| | | |
|---|---|---|
| 4,680,086 | 7/1987 | Thomas et al. ..................... 438/721 |
| 5,160,407 | 11/1992 | Latchford et al. ................. 438/721 |
| 5,188,980 | 2/1993 | Lai ........................................ 438/721 |
| 5,338,398 | 8/1994 | Szweijkowski et al. ............ 438/721 |

FOREIGN PATENT DOCUMENTS

| | | |
|---|---|---|
| 5-6872 | 1/1993 | Japan . |
| 6-338476 | 12/1994 | Japan . |

*Primary Examiner*—David Brunsman
*Attorney, Agent, or Firm*—Sughrue, Mion, Zinn, Macpeak & Seas, PLLC

[57] ABSTRACT

A method for dry-etching a polycide film composed of a double layer film of a polysilicon film provided on a semiconductor substrate and a metal silicide film provided on said polysilicon film according to the present invention comprises the steps of: a first etching step for etching said silicide film with a first etching gas containing no fluorine-based gasses using a photoresist film as a mask, and a second etching step for etching said polysilicon film with a second etching gas not containing chloride gas and fluorine gas using said patterned metal silicide film and said photoresist film remaining on said metal silicide film after said first etching step as a mask.

13 Claims, 5 Drawing Sheets

METHOD FOR DRY-ETCHING A POLYCIDE FILM

BACKGROUND OF THE INVENTION

1. Field of the Invention

The present invention relates to a method for dry-etching a polycide film formed on a semiconductor substrate, in particular to the dry-etching of a polycide film used for the manufacture of MOS semiconductor devices.

2. Description of the Related Art

With the recent increase in the integration and density of MOS semiconductor devices, in micro-processing fields forming gate electrodes by dry-etching polycide films, the reduction of the micro-loading effect, the decrease in mask area dependency, and the improvement of the selection ratio of insulation films against underlying materials have been demanded. Here, the micro-loading effect means an effect in anisotropic etching that in a fine space formed by patterning a photoresist film on a silicon substrate, since the proportions of ions and radicals incident slightly diagonally cannot reach the polycide film due to the interference of the side wall of the photoresist film increase, the etching speed lowers compared with that in a wide space.

In FIG. 5, which shows a sectional view illustrating prior art etching, a gate insulation film (thermal oxide film) 52, a polysilicon film 53, and a metal silicide film 54 are sequentially formed on a silicon substrate 51 constituting a laminate, and on the metal silicide film 54 is formed a photoresist pattern 55. The underlying polysilicon film 53 and the overlying metal silicide film 54 are collectively referred to as a polycide film. In order to form a gate electrode consisting of a polycide film after a layered structure as shown in FIG. 5 is prepared, anisotropic dry-etching is first performed in the first etching step on the overlying metal silicide film 54 through a chemical reaction using an etching gas containing a fluorine-based gas (e.g., $SF_6$). Then in the second etching step, anisotropic etching is performed on the polysilicon film 53 using an etching gas containing $Cl_2$ and HBr but not containing F.

The reason why the polycide film is etched in two steps is that a problem will arise if etching is performed at once from the overlying metal silicide film 54 to underlying polysilicon film 53 under the etching conditions used in the first etching step (etching with a gas containing fluorine-based gas (e.g., $SF_6$)). That is, since the selection ratio against the oxide film is small and the etching speed is high under these etching conditions, when the underlying gate insulation film 52 is very thin (for example, less than 60 nm), the silicon substrate 51 may be etched through the gate insulation film 52, and the diffusion layer may be damaged. Therefore, over-etching cannot be performed sufficiently, and as the result, the underlying polysilicon film 53 is not removed leaving the residue.

Therefore, the two-step etching, in which the overlying metal silicide film 54 and the underlying polysilicon film 53 are etched separately, is required. In the first step etching, however, if even a little amount of the overlying metal silicide film 54 remains, the overlying metal silicide film 54 can be little etched under the second step etching conditions, resulting in poor shape caused by the residue and the like. As FIG. 2 shows, therefore, the first step etching must be performed until the metal silicide film 54 on the place where the etching speed is the lowest is removed.

As described above, however, since an etching gas containing $SF_6$ is used in the first step etching, the micro-loading effect described above increases, and at the same time, since the selection ratio against polysilicon is as small as about 0.5 when this type of etching gas is used, the etching speed (etch rate) of the underlying polysilicon film 53 is about twice higher than the etch rate of the overlying metal silicide 54, the following inconvenience will occur.

For example, difference in etch rates is large between a narrow space pattern of 0.4 μm or less and a wide space pattern, and when the narrow space pattern is completely removed, the underlying polysilicon film 53 under the wide space pattern has already been removed significantly. Since etching proceeds to the gate insulation film 52 when the polysilicon film 53 is thin, substrate damage will easily occur in the place of a wide space pattern if the second step etching is performed in this state. Even if no substrate damages occur, a notch (undercut) 56 as shown in FIG. 3 or a side-etching 57 as shown in FIG. 4 will easily occur in the lower portion of the underlying polysilicon film 53.

As a method to minimize such an inconvenience, there has been proposed an etching method in which an etching gas containing $Cl_2$ and $O_2$ gases of a pressure of about 5 to several tens mT and a plasma density of $1\times10^{11}$ to $1\times10^{13}$ $cm^{-3}$ is used. With this etching method, since the micro-loading effect is smaller, and the selection ratio against polysilicon is larger than in the method using a fluorine-based gas described above, the above problems can be solved. On the other hand, however, due to the use of $Cl_2$ gas, the selection ratio against the photoresist is small, resulting in the occurrence of beveling 58 on the metal silicide film 54 as shown in FIG. 5. This phenomenon will become significant as the size of the gate electrode will decrease. This is because a KrF excimer laser (248 nm) and the like will be used as a light source in place of conventionally used i-line (365 nm) for the miniaturization of semiconductor devices; however, the etching resistance of the photoresist for excimer laser exposure is inferior to the etching resistance of the photoresist for i-line, and decrease in film thickness during developing and etching.

In order to avoid the thickness decrease of the photoresist film 55 as much as possible, a method is considered in which the plasma density is increased, and energy for incorporating ions, which is the etchant, is decreased. By this method, however, the number of radicals increases due to a high plasma density, and accordingly, the horizontal component of the kinetic energy of the etchant for the silicon substrate 51 increases, resulting in the loss of anisotropy of etching, and the occurrence of side-etching 59 (FIG. 6) or inversely tapered notch 56 (FIG. 3) on the metal silicide film 54.

In contrast, in the first etching step, when the plasma density is not increased so much, and the etchant ion incorporating energy is decreased to a value not causing defective shape such as side etching 59 and the notch 56 to occur, no beveling is produced. However, as FIG. 2 shows, the state may occur in which the residual photoresist film 55 is little present on the end portions of the pattern, and the margin is small. Therefore, also in the second etching step, the more photoresist 55 is removed, and if the time for over-etching becomes long, the amount of the photoresist film 55 removed in the second etching step cannot be neglected. Therefore, since improvement cannot be fully achieved by only change in the etching conditions of the first etching step, change in the etching conditions of the second etching step is also required.

In the second etching step, it is required to etch only the underlying polysilicon film 53, but not to remove the thin gate insulation film 52 as much as possible. For this, increase in the plasma density to the order of $1\times10^{12}$ cm$^{-3}$ is attempted to improve the selection ratio against the gate insulation film 52. However, due to increase in the plasma density, the number of high-energy electrons increases, and the charge-up phenomenon, in which electric charge is accumulated on the gate electrode (polysilicon film 53) on the gate insulation film 52, will easily occur. The charge-up phenomenon is well known to cause the poor withstand voltage of the gate insulation film 52. Even when no charge-up phenomenon occurs, the notch 56 may be produced in the interface between the polysilicon film 53 and the gate insulation film 52 as FIG. 3 shows.

As an improved second etching step, there is a method in which the metal silicide film 54 having a high melting point is etched in the first etching step by an etching gas containing a fluorine-based gas and HBr to immediately before the interface with the polysilicon film 53, and the remaining portion of the metal silicide film having a high melting point and the polysilicon film are etched in the second etching step by an HBr-based etching gas or an etching gas containing Cl$_2$ and HBr. By this method, high anisotropy of etching is achieved in the second etching step through the deposition of the reaction product of the photoresist and Br having the side wall protection effect, and the occurrence of the undercut or notch on the polysilicon film can be prevented.

However, since ECR (Electron Cyclotron Resonance) plasma of a high radical concentration (plasma density: $1\times10^{12}$ to $1\times10^{13}$ cm$^{-3}$) is used, if deposition decreases weakening the side-wall protection effect accompanied by the improvement of selection ratios against the photoresist, side-etching 57 occurs easily on the polysilicon film 53 as FIG. 4 shows.

In conventional etching methods as described above, since at least one of causes for poor withstand voltage, such as decrease in the thickness of the photoresist film or defective shapes such as the beveling of the gate electrode by high plasma, side-etching, notch, and charge-up, occurs accompanied by narrower gate electrodes, these methods have not been applied to such devices as the initial thickness of the gate electrode is less than 6 nm. On the other hand, the gate structure tends to be thinner with increase in planar semiconductor devices, and therefore, the etch rate of polysilicon films, especially in the second etching step, is no longer required to be high as in conventional methods. Therefore, for the control of the end-point (end-point detection), an etch rate of 100 to 200 nm/min is considered to be suitable. The control of the end point used herein means to control stopping etching based on change in the intensity of light emitting by the completion of reaction when all the substances to be etched have been removed, or the differential value thereof.

BRIEF SUMMARY OF THE INVENTION

Object of the Invention

Therefore, the object of the present invention is to provide a method for dry-etching a polycide film that can reduce the occurrence of defective shapes such as the beveling of the gate electrode, side-etching, and notch.

Summary of the Invention

A method for dry-etching a polycide film composed of a double layer film of a polysilicon film provided on a semiconductor substrate and a metal silicide film provided on said polysilicon film according to the present invention comprises a first etching step for etching the silicide film with a first etching gas containing no fluorine-based gasses using a photoresist film as a mask, and a second etching step for etching the polysilicon film with a second etching gas containing no chroline and fluorine-based gases using the patterned metal silicide film and the photoresist film remaining on the metal silicide film after the first etching step as a mask.

BRIEF DESCRIPTION OF THE DRAWINGS

The above-mentioned and other objects, features and advantages of the present invention will become more apparent by reference to the following detailed description of the invention taken in conjunction with the accompanying drawings, wherein.

DETAILED DESCRIPTION OF THE INVENTION

Figure 7:
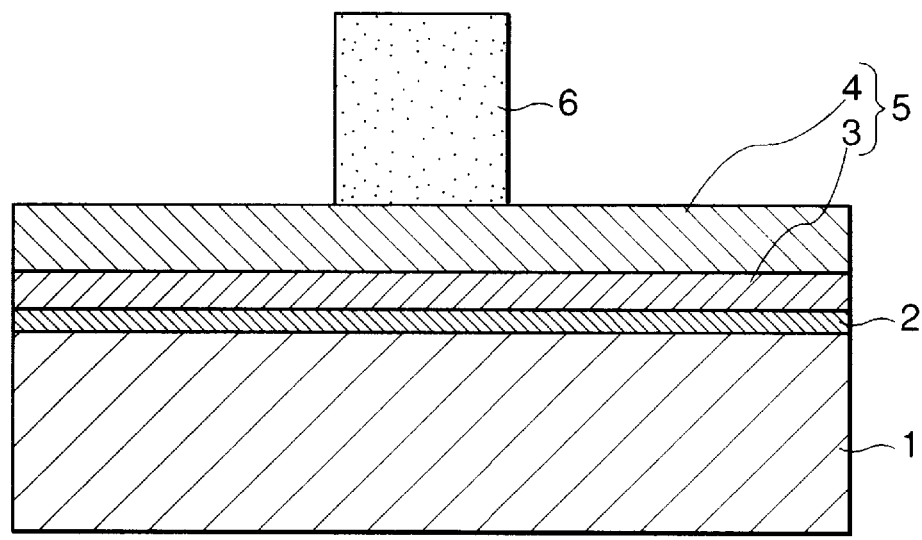
FIG. 7 is a cross-sectional view illustrating the present invention.

The first embodiment of the present invention will be described referring to FIGS. 7 through 10. As FIG. 7 shows, the sample to be etched comprises a laminate structure consisting of a silicon substrate 1, a gate insulation film 2 of a thickness of about 10 nm, a doped silicon film 3 that has been made to be of a low resistance by doping a large amount of an impurity such as phosphorus (P), a tungsten silicide (WSi) film 4, and a photoresist pattern 6. The underlying doped silicon film 3 and the overlying tungsten silicide film 4 constitute a tungsten polycide film 5.

Figure 8:
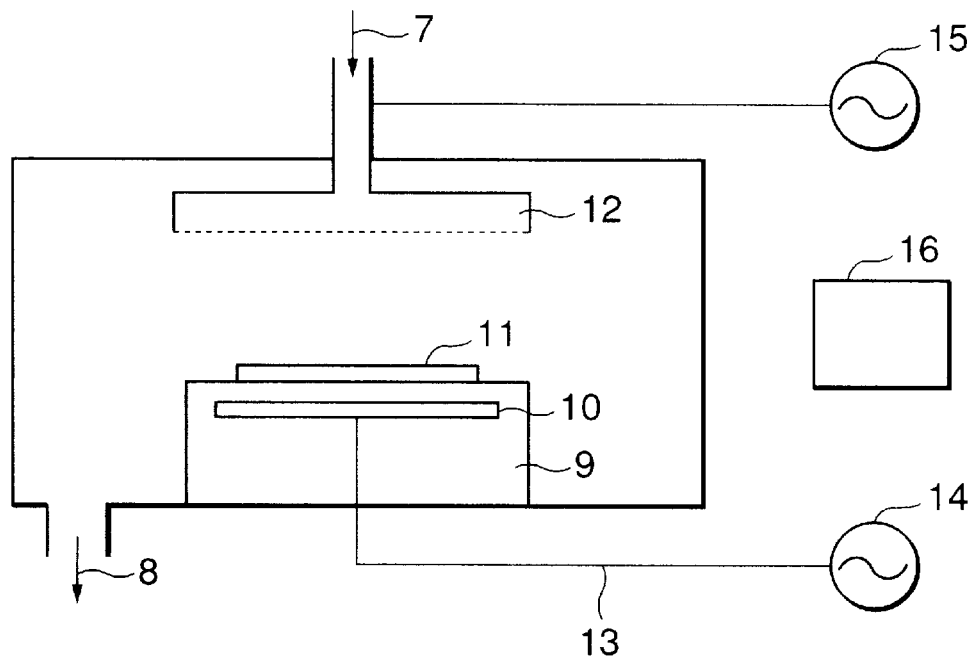
FIG. 8 is a diagram showing the constitution of a dry etchant used in the present invention.

The dry-etcher used in this embodiment is called an IEM (Ion Energy Modulation) system, which utilizes the RIE (Reactive Ion Etching) technology with the functions of impressing a radio-frequency (RF) voltage to the upper and lower electrodes, and controlling the phase difference of the RF voltage. As FIG. 8 shows, this equipment has an etching stage 9 for supporting the sample to be etched, a lower electrode 10, an upper electrode also functioning as a shower head 12, an RF table 13, a lower electrode RF power source 14 for supplying electric power to the lower electrode 10, an upper electrode RF power source 15 for supplying electric power to the upper electrode 12, and a modulator 16 for controlling phase difference of RF voltage supplied to the upper and lower electrodes, and is capable of generating plasma of a density of about $1\times10^{11}$ cm$^{-3}$. Among dry-etching, RIE is classified as anisotropic etching, and has advantages that the etch rate is high, and etching advances in the vertical direction because ions impinge only in the depth direction. The numerals 7, 8 and 11 in these drawings represent the material gas supplied to the dry-etcher, the exhaust gas from the dry-etcher, and a silicon wafer as the sample to be etched, respectively.

Next, a method for dry-etching the tungsten polycide film 5 (method for forming a gate electrode) will be described.

First, as FIG. 7 shows, a gate insulation film 2 of a thermal oxide is formed on a silicon substrate 1, then a doped silicon film 3 is formed on the gate insulation film 2 using CVD (Chemical Vapor Deposition). Then, a tungsten silicide film 4 as a metal silicide film is deposited on the doped silicon film 3 using PVD (a method for coating a surface with a substance vaporized in a vacuum) or CVD. By this the doped silicon film 3 and the tungsten silicide film 4 constitute the tungsten polycide film 5. Next, a photoresist is applied to the surface of the tungsten silicide film 4 and exposed, then developed and patterned to form a photoresist pattern 6 corresponding to the shape of the gate electrode. In this embodiment, the developing conditions are established to make the thickness of the residual photoresist film after development twice the thickness of the tungsten silicide film 4 or more. This value can be accomplished easily also by a photoresist for KrF excimer laser exposure.

Next, the overlying tungsten silicide film 4 is subjected to first dry-etching with the dry-etcher described above under the following conditions:

First Step Etching Conditions
$Cl_2/O_2$=90/10 sccm (standard cubic centimeter per minute)
Pressure=10 mT
RF power for upper/lower electrodes=600/100 W
RF phase difference of upper and lower electrodes=180°

Figure 6:
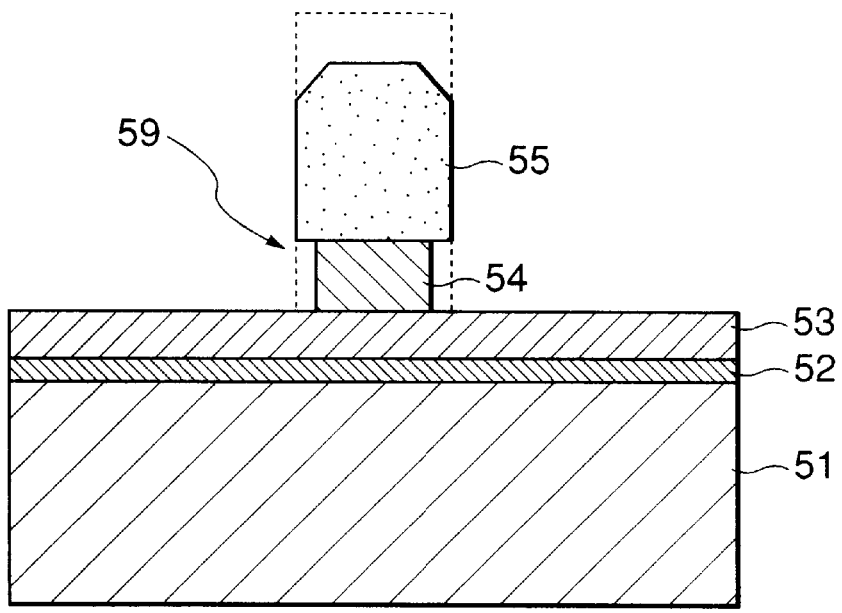
FIG. 6 is a cross-sectional view illustrating a problem in prior art etching methods.

The etch rate of the tungsten silicide film 4 under these conditions is 250 nm/min, the tungsten silicide-to-photoresist selection ratio is about 1 to 1.3. If the above selection ratio is 1.5 or more, the deposition provided from the photoresist film 6 decreases the side-wall protecting effect weakens resulting in the occurrence of the side-etching of the tungsten silicide film 4 (see FIG. 6).

As the plasma source in this embodiment, ECR or ICP (Inductively Coupled Plasma) is used. Since the plasma density of such a plasma source is as high as the order of $1\times10^{12}$ to $1\times10^{13}$ cm$^{-3}$ under conventional conditions, it is preferred to shift the conditions toward decreasing the source power and increasing the bias to make the etch rate of the tungsten silicide film 4 250 nm/min, and the plasma density the order of $1\times10^{11}$ cm$^{-3}$. If the plasma density is excessively high, the re-dissociation of the deposition by plasma will easily occur, the side-wall protecting effect decreases, and the ion scattering speed component and the radical concentration increases, causing side-etching to proceed easily. Normal RIE is also not preferred, because the plasma density is $1\times10^{10}$ cm$^{-3}$ resulting in the shortage of the plasma density and the decrease of etch rate.

Figure 9:
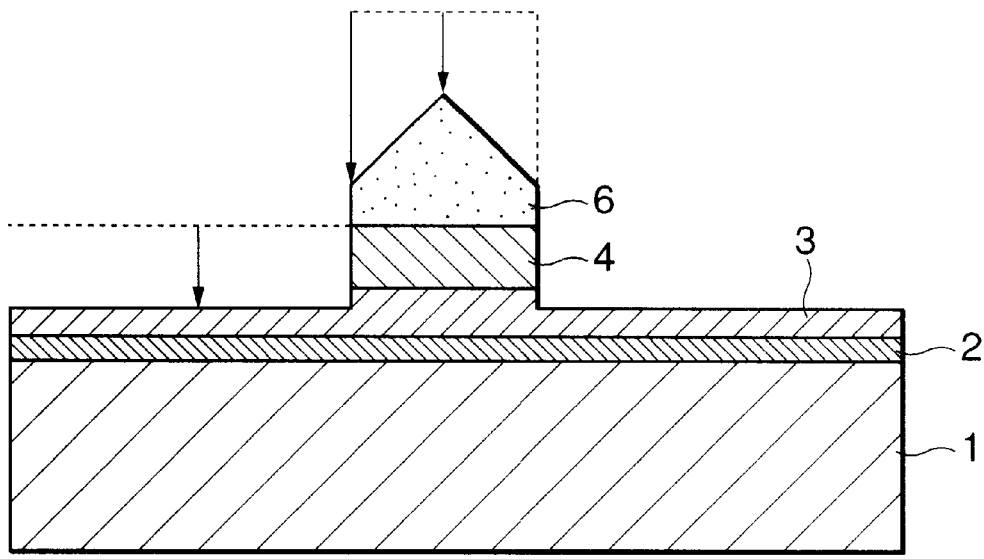
FIG. 9 is a cross-sectional view at the completion of the first etching step in the present invention.
Figure 10:
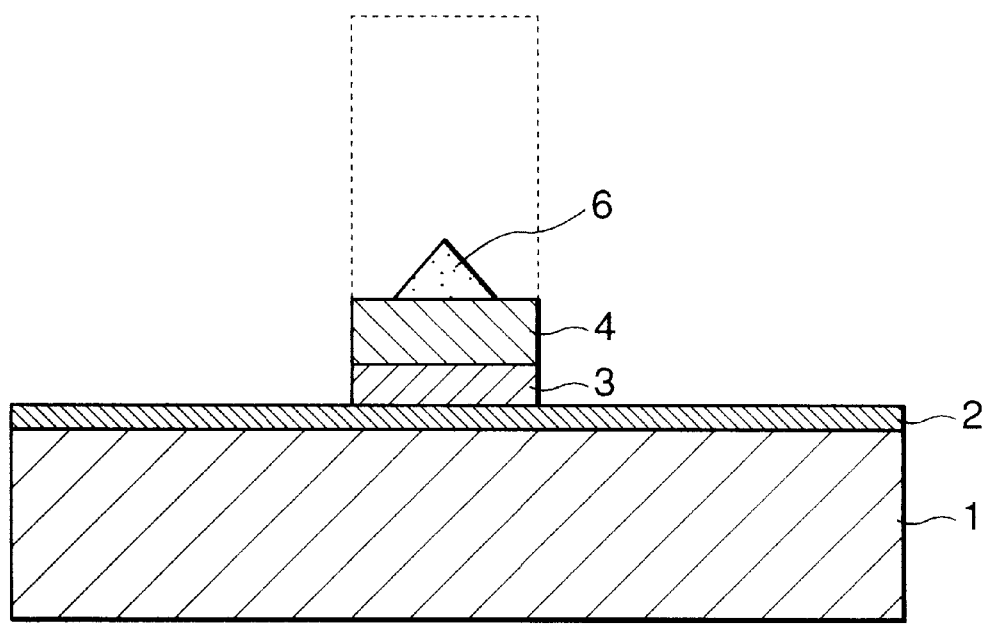
FIG. 10 is a cross-sectional view at the completion of the second etching step in the present invention.

In the dry-etching of the tungsten silicide film 4, which is the narrowest space described above, dry-etching is performed for the time required for completely removing the tungsten silicide film 4 plus a predetermined time α (see FIG. 9). Although the photoresist pattern 6 is considerably removed during this time, the beveling of the tungsten silicide film 4 is not yet started as FIG. 9 shows even when the selection ratio is the minimum of 1. In other words, how small the thickness of the photoresist film 6 may be at this time as long as no beveling occurs.

Next, the underlying doped silicon film 3 is subjected to second dry-etching under the following conditions:

Second Step Etching Conditions
HBr alone or HBr/$O_2$=150 sccm
Pressure=100 mT
RF power for upper/lower electrodes=500/100 W
RF phase difference of upper and lower electrodes=135°
(The RF phase of the upper electrode is ahead.)

The etch rate of the doped polysilicon film 3 under these conditions is 170 nm/min, the selection ratio against the gate insulation film (oxide film) is about 60 to 80. If the phase difference of the upper and lower electrode is 90° or the bias is decreased, the selection ratio will become even higher. Since what plays the role of the mask in this second etching is the tungsten silicide 4 which has been dry-etched in first etching, the photoresist pattern 6 may disappear during this dry-etching (see FIG. 10). This is because the etch rate of the tungsten silicide 4 is less than 3 nm/min, and the tungsten silicide 4 plays the hard mask of the doped polysilicon film 3. If the photoresist pattern 6 has disappeared, the phenomenon that carbon is released from the decomposed photoresist during dry-etching is prevented and the selection ratio against the gate insulation film (thermal oxide film) 2 is lowered.

Figure 1:
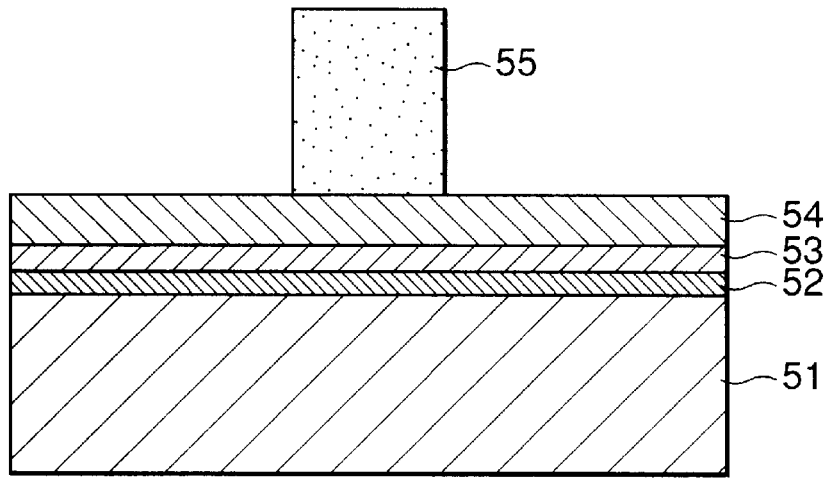
FIG. 1 is a cross-sectional view illustrating a prior art etching method.
Figure 2:
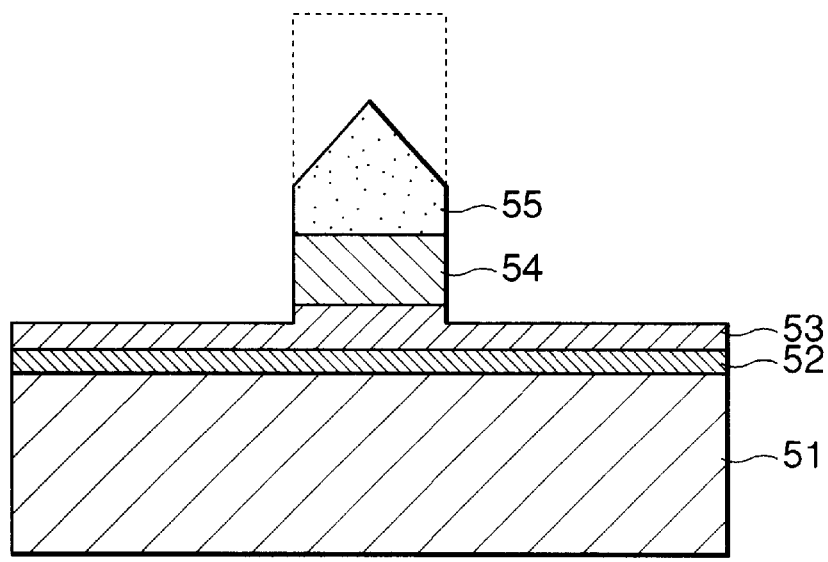
FIG. 2 is a cross-sectional view at the completion of the first etching step in the a prior art etching method.
Figure 3:
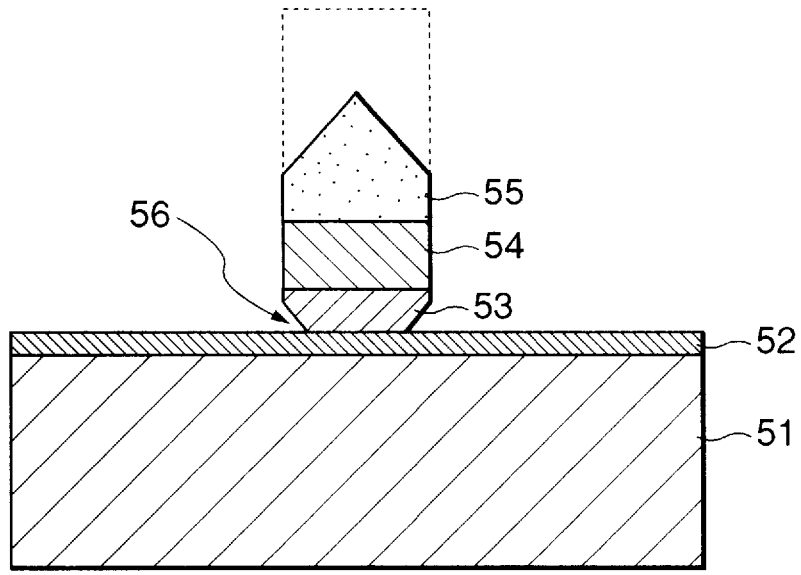
FIG. 3 is a cross-sectional view illustrating a problem in prior art etching methods.
Figure 4:
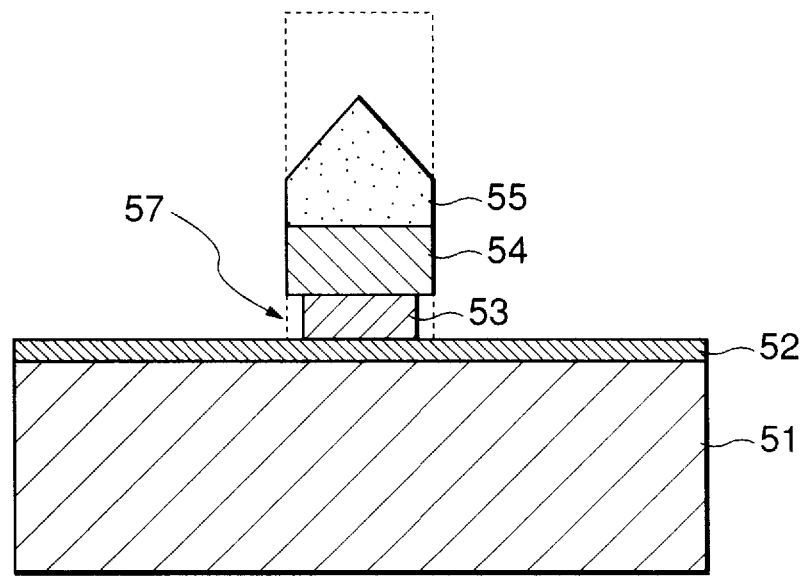
FIG. 4 is a cross-sectional view illustrating a problem in prior art etching methods.
Figure 5:
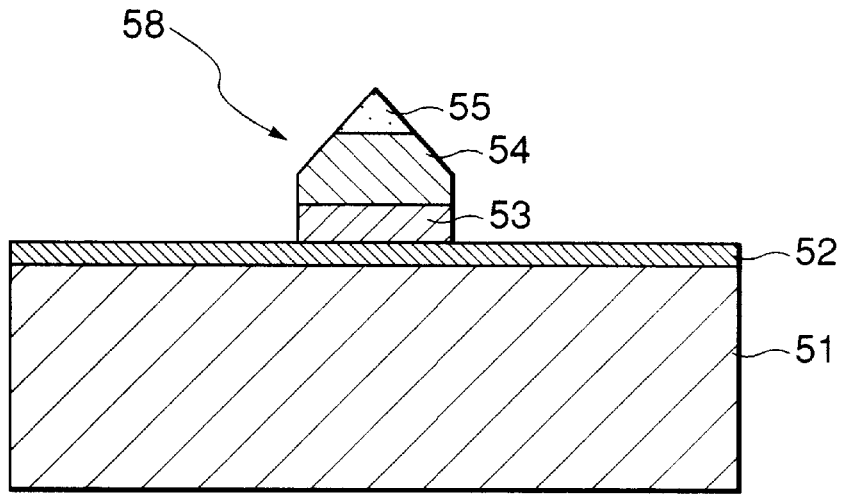
FIG. 5 is a cross-sectional view illustrating a problem in prior art etching methods.

In dry-etching in conventional etching methods using an HBr-based etching gas or an etching gas containing $Cl_2$ and HBr, radical concentration is high and anisotropy is easily lost because a high-density plasma such as ECR plasma (of a plasma density of $1\times10^{12}$ to $1\times10^{13}$ cm$^{-3}$) is used (see FIG. 4). If the plasma density is high, a lot of electrons with high energy are generate and charge-up is likely to occur, or notches are easily produced in the interface with the gate insulation film (see FIG. 3). Furthermore, in radical etching, the etch rate is very sensitive to the quality of the doped silicon film or the amount of the dopant. (Change in the etch rate before and after doping is 20 to 40 percent.)

In contrast, in dry etching of this embodiment using HBr gas alone or an HBr/$O_2$ gas, since the plasma density is in the order of $1\times10^{11}$ cm$^{-3}$, the radical concentration is lower than that of high-density plasma, and therefore the scattered radical speed component parallel to the silicon wafer 11 is small, little anisotropy is lost. The high selection ratio, which is an advantage of high-density plasma, of almost the same value as in the use of an ECR plasma source (polysilicon-to-oxide selection ratio of 60 to 100) can be achieved when the pressure is set to about 100 mT. In addition, since radical etching is inhibited with little lowering ion energy, the etch rate is little affected by the quality of the doped silicon film 3 or the amount of the dopant. (Change in the etch rate before and after doping is 10 to 20 percent.)

After the underlying gate insulation film 2 is exposed, over-dry-etching is continued under the same conditions. The exposure of the gate insulation film 2 can be detected by EPD (End Point Detector), for example through the start of decrease in the change (gradient) of emitting light having a wavelength of 405 nm, whereby the accurate etching time can be determined. By two-step dry-etching, for example, 100 to 150 nm when converted to film thickness, no doped polysilicon 3 remains on the step portion of the gate insulation film 2, and no notches, side-etching, or damage of the substrate occur.

According to the method for dry-etching of this embodiment, since dry-etching is performed by setting the etching gas system to the conditions not to remove the tungsten silicide film 4, and using the tungsten silicide film 4 as the mask, the occurrence of beveling of the metal silicide film due to decrease in the thickness of the photoresist film can be prevented completely, and the problem that the amount of over-etching is limited by the remaining photoresist film is solved.

Also, since the plasma density is set to the order of $1\times10^{11}$ cm$^{-3}$ in the second-step etching conditions, defective shape such as side-etching and notches, and the cause of poor withstand voltage such as charge-up, which raise problems when high-density plasma is used, can be minimized without impairing other properties.

In addition, in the second etching step, since HBr gas alone or HBr/O$_2$ gas is used, the etch rate of the doped silicon 3 can be about 100 to 200 nm/min, resulting a better end-point detection.

Next, the second embodiment of the present invention will be described. Dry-etching as in the embodiment 1 is repeated except that after first etching almost the same as in the first embodiment has been completed, the silicon wafer 11 is removed from the dry-etcher (FIG. 8), and was subjected to surface cleaning treatment, such as ammonia/hydrogen peroxide treatment or sulfuric acid/hydrogen peroxide treatment sequentially. By these ammonia/hydrogen peroxide treatment or sulfuric acid/hydrogen peroxide treatment, the photoresist film 6 remaining on the tungsten silicide film 4 and the deposition on the side wall of the gate insulation film 2 are completely removed.

Then, in order to remove the natural oxide film, the silicon wafer is subjected to the third etching step under almost the same conditions as in the first embodiment for a predetermined time (e.g., 5 sec), then subjected to the second etching step under almost the same conditions as described in the first embodiment. Since the mask used in the second etching step is the tungsten silicide film 4, not the photoresist film 6, the effect of carbon supplied from the photoresist film 6 is completely eliminated. This mask of the tungsten silicide film 4 is the mask not required to remove after etching.

Since the effect of carbon is completely eliminated, the polysilicon/oxide selection ratio can be increased, eliminating needs for decreasing ion energy and increasing plasma density. As a result, defective shape such as notches and side-etching, and the cause of poor withstand voltage such as charge-up, frequently observed in conventional methods, can be minimized.

Almost the same effect as in the first embodiment can also be achieved by the second embodiment. In addition since the photoresist pattern 6 is completely removed, a higher polysilicon/oxide selection ratio than in the first embodiment can be secured.

Although the present invention has been described with reference to specific embodiments, this description is not meant to be construed in a limiting sense. Various modifications of the disclosed embodiments will become apparent to persons skilled in the art upon reference to the description of the present invention. It is therefore contemplated that the appended claims will cover any modifications or embodiments as fall within the true scope of the invention.

What is claimed is:

1. A method for dry-etching a polycide film composed of a double layer film of a polysilicon film provided on a semiconductor substrate and a metal silicide film provided on said polysilicon film, comprising:

etching, for patterning, said metal silicide film with a first etching gas containing no fluorine-based gasses using a photoresist film as a mask, and etching, for patterning, said polysilicon film with a second etching gas containing no chlorine-based gasses and no fluorine-based gasses using said patterned metal silicide film as a mask, and wherein said photoresist film on said metal silicide film disappears after etching with said first etching gas.

2. A method for dry-etching a polycide film according to claim 1, wherein said first etching gas is either one selected from a group consisting of Cl$_2$/O$_2$ gas and HCl/O$_2$ gas.

3. A method for dry-etching a polycide film according to claim 2, wherein said second etching gas is either one selected from a group consisting of HBr gas and HBr/O$_2$ gas.

4. A method for dry-etching a polycide film according to claim 1, wherein said second etching gas is either one selected from a group consisting of HBr gas and HBr/O$_2$ gas.

5. A method for dry-etching a polycide film according to claim 1, wherein said metal silicide is tungsten silicide.

6. A method for dry-etching a polycide film according to claim 1, wherein the plasma density in said second etching step is in the order of $1\times10^{11}$ cm$^{-3}$.

7. A method for dry-etching a polycide film according to claim 1, wherein said photoresist film on said metal silicide film disappears during etching with said second etching gas.

8. A method for dry-etching a polycide film composed of a double layer film of a polysilicon film provided on a semiconductor substrate and a metal silicide film provided on said polysilicon film, comprising:

etching, for patterning, said silicide film with a first etching gas containing no fluorine-based gasses using a photoresist film as a mask, removing said photoresist film remaining on said patterned metal silicide film, and etching, for patterning, said polysilicon film with a second etching gas containing no chloride-based gas and no fluorine-based gas using said patterned metal silicide film as a mask.

9. A method for dry-etching a polycide film according to claim 8, wherein said first etching gas is either one selected from a group consisting of Cl$_2$/O$_2$ gas and HCl/O$_2$ gas.

10. A method for dry-etching a polycide film according to claim 9, wherein said second etching gas is either one selected from a group consisting of HBr gas and HBr/O$_2$ gas.

11. A method for dry-etching a polycide film according to claim 8, wherein said second etching gas is either one selected from a group consisting of HBr gas and HBr/O$_2$ gas.

12. A method for dry-etching a polycide film according to claim 8, wherein said metal silicide is tungsten silicide.

13. A method for dry-etching a polycide film according to claim 8, wherein the plasma density in said second etching step is in the order of $1\times10^{11}$ cm$^{-3}$.

* * * * *